United States Patent
Voutsas et al.

(10) Patent No.: US 6,878,640 B2
(45) Date of Patent: Apr. 12, 2005

(54) METHOD FOR FABRICATING SILICON TARGETS

(75) Inventors: Apostolos Voutsas, Vancouver, WA (US); John Hartzell, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 10/749,060

(22) Filed: Dec. 30, 2003

(65) Prior Publication Data

US 2004/0140206 A1 Jul. 22, 2004

Related U.S. Application Data

(62) Division of application No. 09/862,107, filed on May 21, 2001, now Pat. No. 6,673,220.

(51) Int. Cl.[7] .................... H01L 21/302; H01L 21/461
(52) U.S. Cl. .................... 438/753; 438/460; 438/462; 438/692; 438/977; 204/298.13
(58) Field of Search ........................... 438/459, 460, 438/462, 692, 734, 753, 977; 204/298.12, 298.13, 192.12, 192.23

(56) References Cited

U.S. PATENT DOCUMENTS

| 5,836,506 | A | * | 11/1998 | Hunt et al. | 228/172 |
|---|---|---|---|---|---|
| 6,019,666 | A | * | 2/2000 | Roberts et al. | 451/36 |
| 6,073,830 | A | * | 6/2000 | Hunt et al. | 228/203 |
| 6,464,847 | B1 | * | 10/2002 | Kumahara et al. | 204/298.12 |
| 6,533,907 | B2 | * | 3/2003 | Demaray et al. | 204/192.25 |
| 6,774,009 | B1 | * | 8/2004 | Johnson et al. | 438/455 |

* cited by examiner

*Primary Examiner*—Maria F. Guerrero
(74) *Attorney, Agent, or Firm*—David C. Ripma; Matthew D. Rabdau; Joseph P. Curtin

(57) ABSTRACT

A method for fabricating silicon tiles and silicon tile targets has been provided, such as may be used in the sputter deposition of thin film transistor (TFT) silicon films. The method describes processes of cutting the tiles, beveling the tiles edges, etching the tiles to minimize residual damage caused by cutting the tiles, polishing the tiles to a specified flatness, and attaching the tiles to a backing plate. All these processes are performed with the aim of minimizing contamination and particle formations when the target is used for sputter deposition.

36 Claims, 6 Drawing Sheets

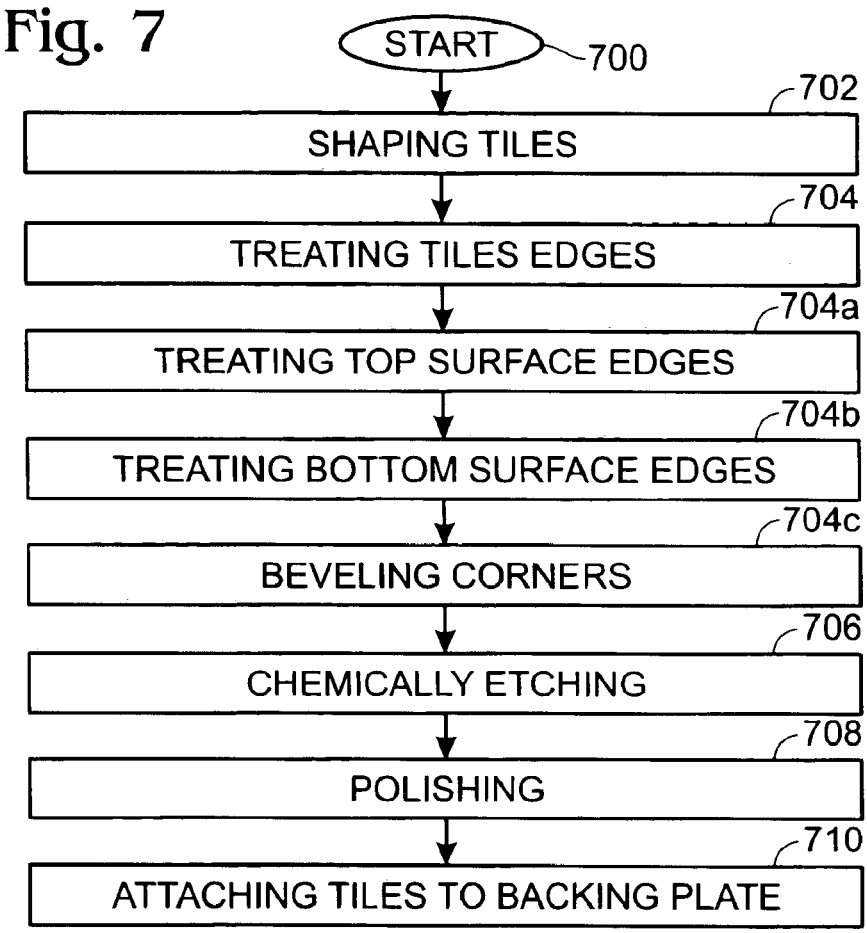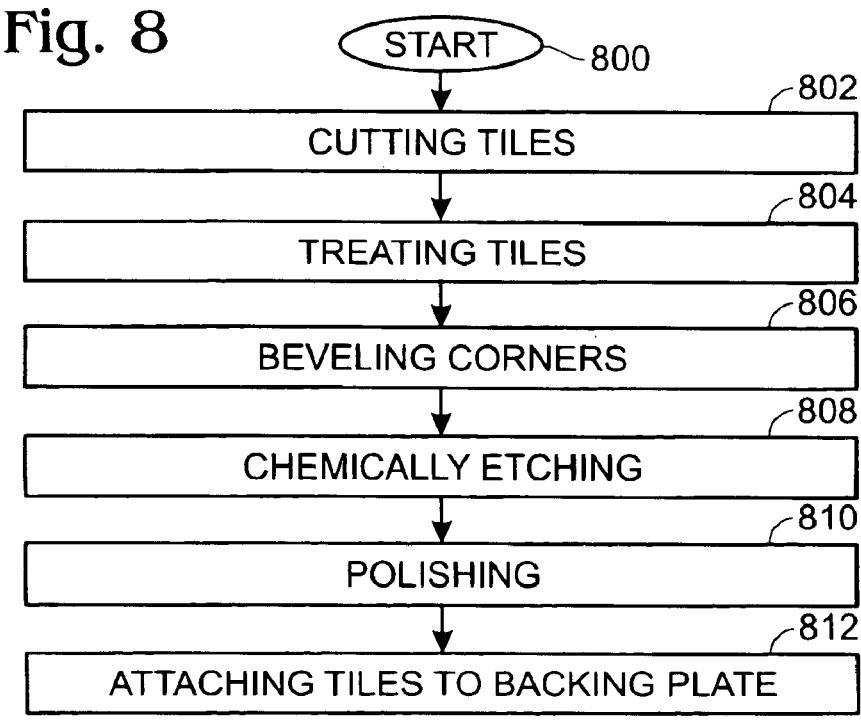

METHOD FOR FABRICATING SILICON TARGETS

CROSS REFERENCE TO RELATED APPLICATION

This application is a divisional of application Ser. No. 09/862,107, filed May 21, 2001, entitled "System and Method for Fabricating Silicon Targets," invented by Voutsas et al., now U.S. Pat. No. 6,673,220.

BACKGROUND OF THE INVENTION

1. Field of the Invention

This invention generally relates to integrated circuit (IC) fabrication and, more particularly, to a system and method for forming silicon targets for use in sputter deposition processes.

2. Description of the Related Art

Research continues into methods of producing polycrystalline (p-Si) film by annealing amorphous silicon (a-Si) films. Polycrystalline films are used in the formation of IC active areas, such as the source, drain, and gate regions of a transistor. One specific application is the formation of thin film transistors (TFTs) that are used in the fabrication of active matrix (AM) liquid crystal displays (LCDs).

One relatively recent approach to forming an amorphous silicon film is through silicon (Si) sputter deposition. Little prior art exists in this field, as the application of sputtering method for silicon deposition in microelectronics (i.e. TFTs) is quite new. There is a body of work in the use of silicon targets for sputtering of optical coatings (SiO2, SiNx), but this application differs. The optical coatings are particularly valued for their optical characteristics, not their electrical characteristics. In some circumstances these optical coating targets are heavily doped to improve conductivity of the resulting film. However, a highly doped silicon film cannot be formed into a transistor active area. Furthermore, these optical coatings are a continuous blanket films and, therefore, little regard is paid to particle size and uniformity. Transistor active area silicon films are patterned, however, often to small geometries. Therefore, the particle composition, of little regard in a blanket optical coating film, is critical in the formation of transistor silicon film.

FIGS. 1a through 1e are partial cross-sectional diagrams illustrating the fabrication of a conventional top-gate TFT structure (prior art). Poly-Si (polycrystalline-Si) TFTs are made by a plurality of processes. In the majority of polycrystalline silicon TFT LCD applications, the so-called top-gate, polycrystalline silicon TFT structure is used. Typically, Plasma-Enhanced Chemical Vapor Deposition (PE-CVD) or Low-Pressure CVD (LPCVD) is used to deposit the amorphous silicon precursor. There are several advantages in using physical vapor deposition (PEV) or sputtering to form the silicon film. Such advantages are a reduction in process steps, as there is no need for dehydrogenation, equipment cost reduction, and improved process safety, since no toxic/pyrophoric gases are necessary.

In FIG. 1a a barrier layer 10 is deposited over a substrate 12. Amorphous silicon is deposited over barrier layer 10 and annealed, using an Excimer Laser for example, to form polycrystalline silicon layer 14.

In FIG. 1b the polycrystalline silicon layer 14 is patterned and dry etched.

In FIG. 1c a gate isolation layer 16 is formed over the polycrystalline silicon layer 14. A gate 18 is formed over gate isolation layer 16, and the source region 20 and drain region 22 are implanted with P material.

In FIG. 1d an interlayer dielectric 24 is isotropically deposited.

In FIG. 1e the interlayer dielectric 24 is selectively etched to form vias to the source/drain regions 20/22. A source contact 26 and a drain contact 28 are deposited and patterned. The present invention is concerned with the sputter deposition of the amorphous silicon used to from polycrystalline silicon layer 14 (FIG. 1a).

FIG. 2 is a partial cross-sectional diagram of a typical DC magnetron sputtering chamber (prior art). One of the key aspects of the silicon-sputtering process is the 'target' component. The target is a block of the material to be deposited, mounted on an appropriate metal backing plate, and placed opposite to the substrate where the film is to be deposited. Plasma strikes in the gap between the target and the substrate. The magnet that is scanning above the target backing plate is used to intensify the plasma and confine it in the region defined by the magnetic field. By scanning the magnet, the plasma is swept across the surface of the target, resulting in deposition of the film on the substrate opposite to the target. The plasma is generated by applying high voltage to an inert gas (typically Ar, but alternately He, Ne, Kr or mixtures) that flows in the region between the target and the substrate. For certain applications, other gases may be mixed to the sputtering gas, such as H2, O2, N2, etc., to alter the composition and/or the properties of the sputtered film.

The target is an important component of the sputtering process because it affects the level of contamination in the film, as well as the level of particles, which are generated during the deposition process. Particles are fragments of silicon material that are detached from the target material during processing. Particles larger than approximately 5 microns are not desirable in TFT process films. Hence, the target manufacturing must proceed in a way that the produced target can yield low levels of contamination in the deposited film as well as a low level of particles. High particle levels result in low yields, as well as reduced equipment up-time, since frequent cleaning of the chamber is required. Film contamination needs to be reduced below acceptable levels, for the films to be suitable for the fabrication of electronic devices.

The issue of particles is particularly severe for silicon targets for two reasons: (1) the target is a tiled assembly (not a single piece), which means that the edges of the tiles can generate particles, unless they are properly prepared; and, (2) the target material is generally of low resistivity (does not conduct thoroughly) as a result of the purity requirements of the deposited film. Hence, the material is susceptible to charge buildup and, consequently, arcing, especially if the surface of the target is not properly conditioned. Arcing may result in increased contamination in the film, especially with the material that the chamber and internal components being made of Al, Ni, or equivalent metals.

It would be advantageous if a process existed for efficiently sputtering silicon to form an amorphous silicon film.

It would be advantageous if the amorphous silicon film could be sputter deposited without particle contaminants.

It would be advantageous if silicon targets existed that minimized contamination in the sputter deposition of amorphous silicon film.

SUMMARY OF THE INVENTION

The present invention involves a procedure to produce silicon targets for use in microelectronics, particularly in the fabrication of polycrystalline silicon TFTs. The silicon tiles and resultant targets demonstrate excellent particle performance and reduced contamination levels in the deposited silicon-films.

Accordingly, a method is provided for forming silicon target tiles in the fabrication of integrated circuit (IC) sputter deposited silicon films. The method comprises: cutting either single-crystal or polycrystalline silicon tiles to a thickness in the range of 7 millimeters (mm) to 10 mm; and, treating the silicon tile edges to minimize the generation of contaminating particles. The silicon tile treatment includes subjecting the silicon tile top and bottom surface edges to a beveling or radiusing operation. The silicon tile top surface edges are beveled within the range of 1 mm to 5 mm, or radiused within the range of 3 mm to 10 mm. The silicon tile bottom surface edges are beveled approximately 1.5 mm. Further, the silicon tile treatment includes beveling the silicon tile corners approximately 1.5 mm.

The method further comprises: chemically etching the silicon tile surfaces to remove silicon material within the range of 50 microns (um) to 500 um; polishing the silicon tile top and bottom surfaces to a predetermined flatness in the range of 0.1 um to 10 um; and, attaching a plurality of the polished silicon tiles to a backing plate to form a completed silicon target.

Additional details of the above-described silicon tile target fabrication method and a silicon target device are described below.

BRIEF DESCRIPTION OF THE DRAWING

FIG. 7 is a flowchart illustrating a method for forming silicon target tiles in the fabrication of integrated circuit (IC) sputter deposited silicon films.

FIG. 8 is a flowchart illustrating an alternate method for a forming a silicon target in the fabrication of IC sputter deposited silicon films.

DETAILED DESCRIPTION OF THE PREFERRED EMBODIMENTS

The present invention describes the fabrication of silicon targets using either single-crystal silicon material or using polysilicon material. The material of the target is important in determining the number of tiles in the final target. A silicon target with a surface of 650 millimeters (mm) by 550 mm requires about 20 single-crystal silicon (c-Si) tiles, but only 4 polysilicon (p-Si) tiles. The number of single-crystal tiles can be reduced by accepting an orientation of silicon material, other than the standard (100) crystallographic orientation. That is, the silicon tiles can be cut lengthwise from the silicon ingot. However, it is likely that a target made from single-crystal material will always include more tiles than a similarly-sized target made from polycrystalline silicon material. The number of tiles affects the overall area of tile edge as well as the number of tile gaps across the face of the target. For this reason, it is best to minimize the number of tile gaps in the target.

Figure 3:
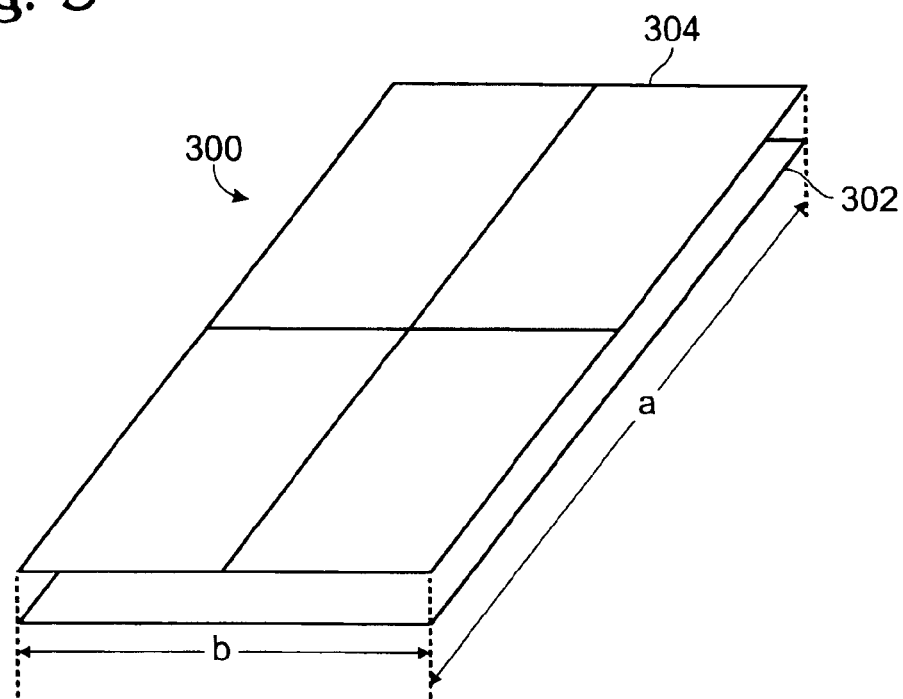
FIG. 3 is a perspective view of the silicon target of the present invention that is used in the fabrication of IC sputter deposited silicon films.

FIG. 3 is a perspective view of the silicon target of the present invention that is used in the fabrication of IC sputter deposited silicon films. The target 300 includes a backing plate 302 and a plurality of silicon tiles 304 attached to the backing plate 302. When silicon tiles 304 are a polycrystalline silicon material, a plurality of four polycrystalline silicon tiles 304 are attached to the backing plate 302, as shown. Alternately, but not shown, when silicon tiles 304 are a single-crystal silicon material, a plurality of twenty single-crystal silicon tiles 304 are attached to the backing plate 302. Preferably, the number of tiles needed to form a target is smaller than the above-stated numbers. The attached plurality of silicon tiles 304 forms a silicon target 300 with the surface of approximately 650 mm by 550 mm. That is, a is 650 mm and b is 550 mm. However, other target dimensions are possible.

The tiles are cut and shaped to size, from a block of the appropriate material. This should be accomplished by a process that results in the least mechanical damage. Residual cutting damage leaves residual stresses, that may cause particle formation and generate arcing spots when the material is used in the sputtering chamber. Different methods are used to cut the tiles, such as: saw cutting, laser cutting, high pressure water, router, etc. Ion milling can be used after the rough cut to precisely cut the tile to specifications. One method that appears to minimize residual damage is saw-cutting followed by ion milling. Regardless of the efforts taken and the cutting procedure used, any residual damage remaining after the cutting must be removed. If it is not, particles are generated from the surface of the tiles.

The preparation and treatment of the tile edges is described in the following drawing explanations. The tile edge is initially beveled in the. 1–5 millimeter (mm) range. Beveling less than 1 mm appears to be ineffective, while a beveling of 5 mm provides satisfactory results. Alternatively, the edge can be radiused. Radiusing requires a radius of more than 1 mm in order to be effective. A small bevel of approximately 1.5 mm is introduced at the bottom of the tile to seal out contamination that may enter the gap between tiles. This feature becomes more important as the target is eroded during sputter deposition, and the distance between the top surface and the bottom surface of the tile becomes smaller. If the bottom edge of the tile is not beveled, depending upon the original beveling size and the thickness of the tile, the plasma may actually reach the bottom of the tile gap and release impurities.

Before the chemically etching of the tiles, the corners of the tiles are also beveled. The corner beveling is desirable from the point of view of stress release, as sharp edges have higher stored stress than smooth edges. To avoid chipping of the tile corners, small corner cuts are made in the four corners of each tile. These are beveled cuts of about 1.5 mm. This feature allows easier handling of the target tiles as they are bonded on the backing plate. The corner cuts also protect the corners from chipping during handling. Chipped corners create sites for particle generation during sputter deposition.

Any damage caused as a result of the shaping (cutting) or treating (beveling) processes is addressed by chemically etching-off the tiles to remove the damaged surface layers. The removal of at least 50 microns (um) of silicon material is necessary, with 100–200 um being more typical, to effectively remove the damaged layers after milling. This etching process takes place by immersion in a HNO3/HF/CH3COOH (4:1:3) solution. Alternative chemistries include HF/HNO3 solutions (1:6–1:8). It is important to stir during etching to improve uniformity. A dump rinse is used to quickly remove the etchant from the surface of the silicon material, and to stop the etching process.

The tiles are polished to improve the surface flatness. Polishing is accomplished by lapping the surface using a small grit paper. Alternatively, polishing can be accomplished by a chemical mechanical polishing (CMP) method, with a SiO2 slurry for example. Equivalent slurries can also be used.

Figure 1A:
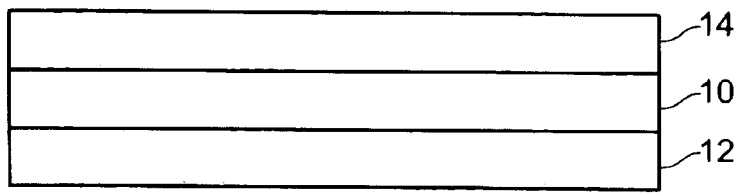
FIGS. 1a through 1e are partial cross-sectional diagrams illustrating the fabrication of a conventional top-gate TFT structure (prior art).
Figure 1B:
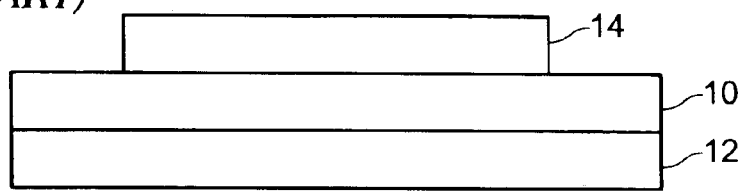
Figure 1C:
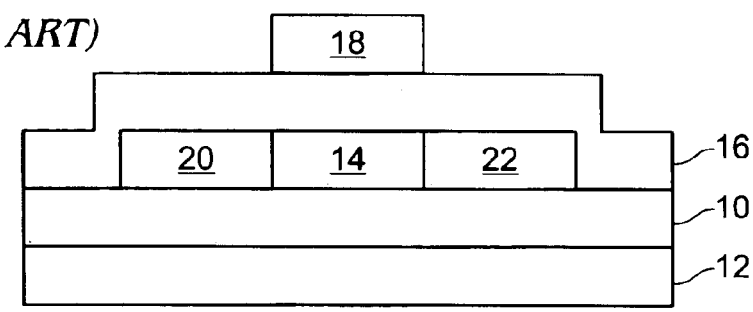
Figure 1D:
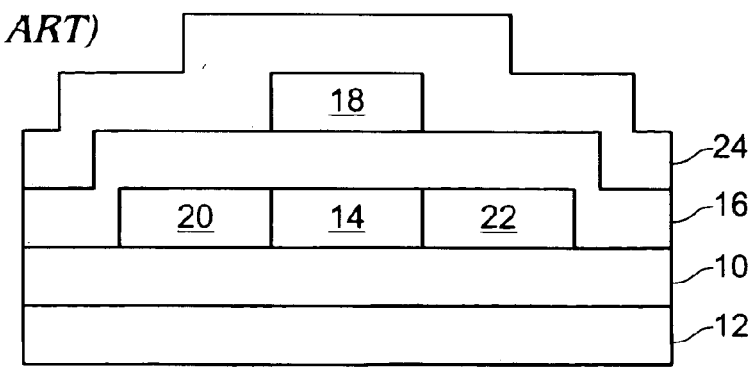
Figure 1E:
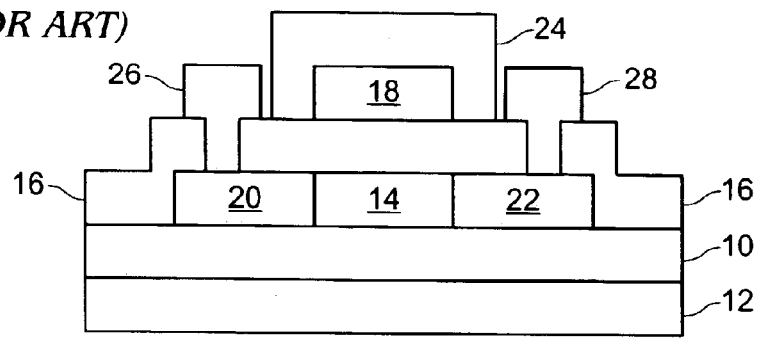
Figure 2:
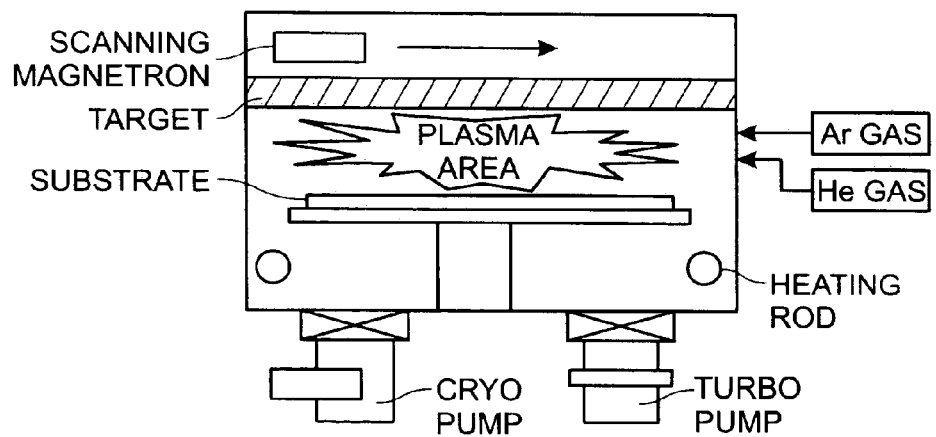
FIG. 2 is a partial cross-sectional diagram of a typical DC magnetron sputtering chamber (prior art).
Figure 4A:
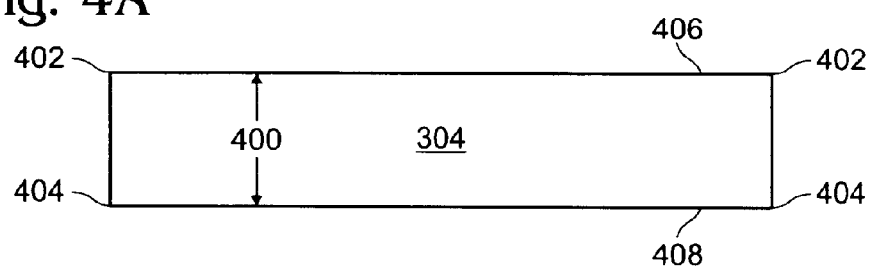
FIGS. 4a through 4g feature detailed aspects of the silicon tile of FIG. 3.

FIGS. 4a through 4g feature detailed aspects of the silicon tile 304 of FIG. 3. FIG. 4a is a partial cross-sectional view of the silicon tile 304. Each silicon tile 304 has a predetermined thickness 400 in the range of 7 mm to 10 mm. Tile 304 also has treated top surface edges 402 and treated bottom surface edges 404. The tile 304 has a top surface 406 and a bottom surface 408 that is attached to the backing plate (see FIG. 3).

Figure 4B:
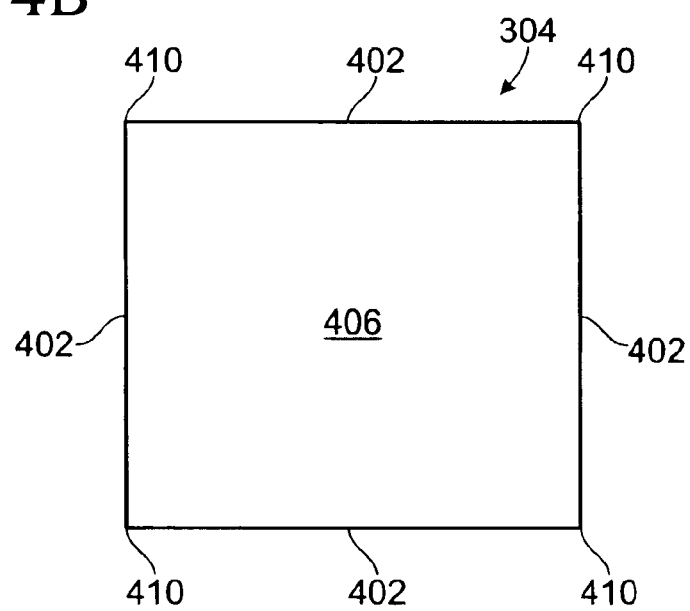

FIG. 4b is a plan view of the top 406 of the silicon tile 304. The four top surface edges 404 can be seen. Although not shown here (see FIG. 5), a plan view of the tile bottom surface would also show four bottom surface edges in the same arrangement as the top surface edges 402. The tile 304 also has treated corners 410.

Figure 4C:
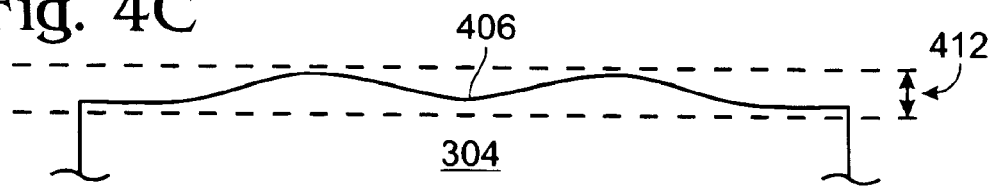

FIG. 4c is a detailed partial cross-sectional view of the silicon tile top surface 406. The top surface has a predetermined flatness 412. Although not shown, the tile bottom surface likewise has a predetermined flatness. In some aspects of the invention, the flatness 412 is in the range of 5 microns (um) to 10 um. In other aspects the flatness 412 is in the range of 1 mm to 6 mm. In yet other aspects, the flatness 412 is in the range of 0.1 mm to 1 mm. These different flatness specifications involve a trade off between process costs and the quality of the deposited silicon film.

Figure 4D:
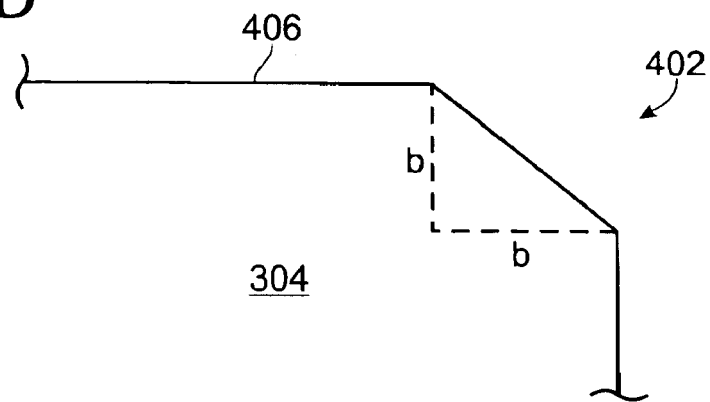

FIG. 4d is a detailed view of a top surface edge 402 of FIG. 4a, featuring the beveled edges. The silicon tile treated top surface edges 402 are beveled within the range of 1 mm to 5 mm. That is, b is in the range of 1 to 5 mm.

Figure 4E:
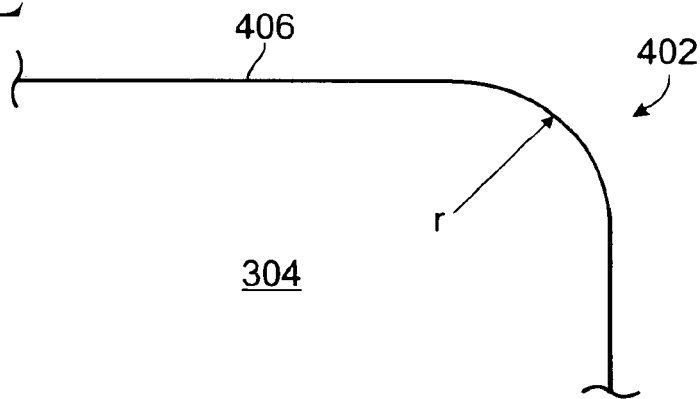

FIG. 4e is a detailed view of the top surface edge 402 of FIG. 4a, featuring the radiused edges. The silicon tile treated top surface edges 402 are radiused within the range of 3 mm to 10 mm. That is, r is in the range of 3 to 10 mm.

Figure 4F:
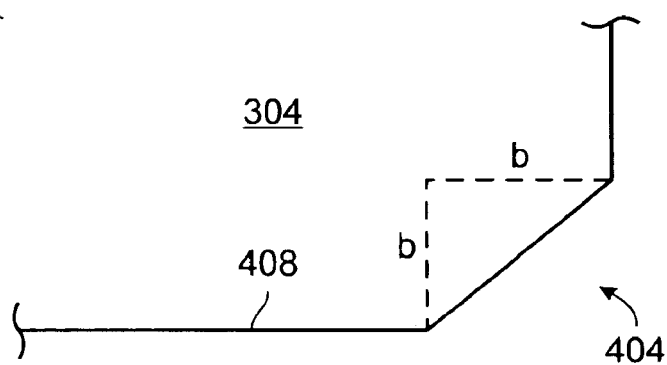

FIG. 4f is a detailed view of a bottom surface edge 404 of FIG. 4a, featuring the beveled edges. The silicon tile treated bottom surface edges 404 are beveled are beveled approximately 1.5 mm. That is, b is approximately 1.5 mm.

Figure 4G:
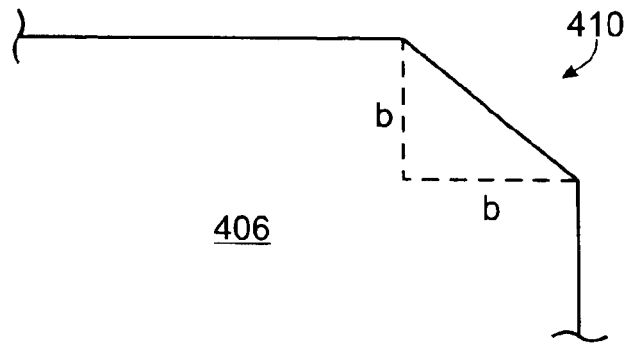

FIG. 4g is a detailed view of the treated corners 410 of FIG. 4b. The silicon tile treated corners 410 are beveled approximately 1.5 mm. That is, b is approximately 1.5 mm.

As mentioned above, the silicon tiles 304 are a material selected from the group including single-crystal silicon (c-Si) and polycrystalline silicon (p-Si). In some aspects of the invention the silicon tiles 304 are a silicon material doped with a p-type dopant with a resistivity in the range from 0.5 to 50 ohms per centimeter. As typically cut, the silicon tiles 304 have a (100) crystallographic orientation.

Figure 5:
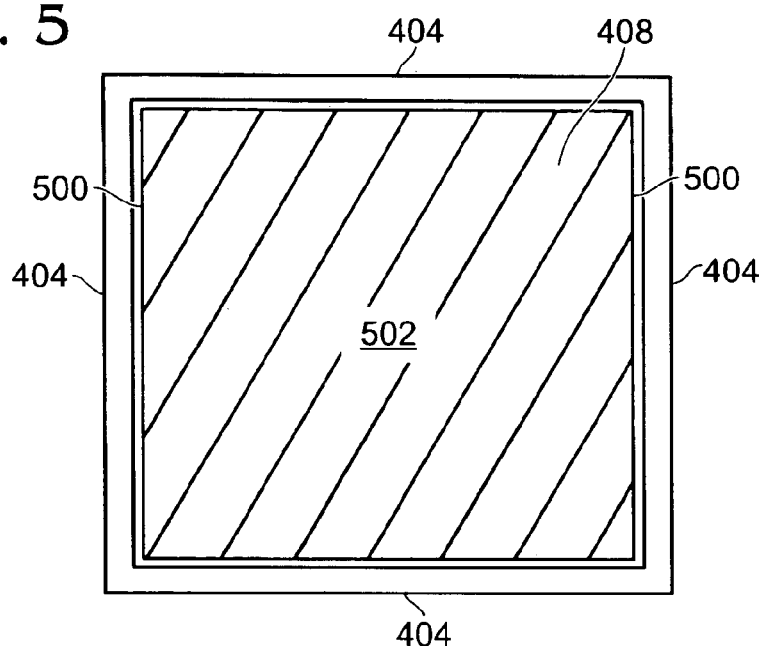
FIG. 5 is a detailed depiction of the silicon tile bottom of FIG. 4a to feature the backing plate attachment.

FIG. 5 is a detailed depiction of the silicon tile bottom 408 of FIG. 4a to feature the backing plate attachment. An adhesive is formed on each silicon tile bottom surface 408, along the bottom surface edges 404 to form an adhesive boundary 500. Indium 502, represented by the cross-hatched area, is placed on each silicon tile bottom surface 408, interior to the adhesive boundary 500. Indium may be evenly applied in the interior area, as shown, or applied in a pattern. The adhesive boundary 500 keeps the indium 502 under the tile 304, to prevent indium contamination in the deposition process.

Figure 6:
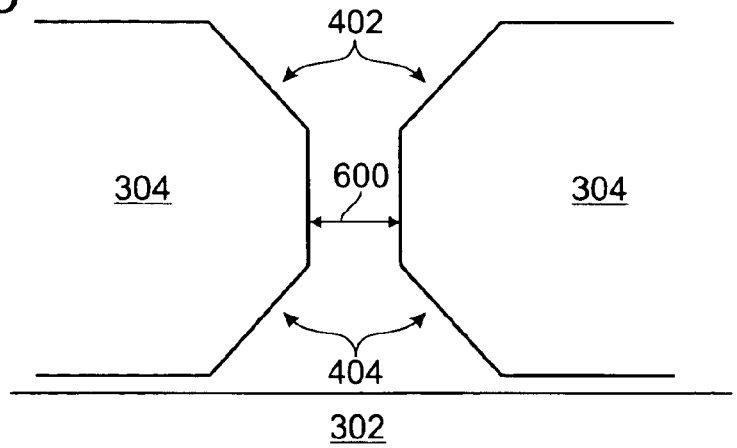
FIG. 6 is a partial cross-sectional view of FIG. 3, featuring the tile gap between the silicon tiles.

FIG. 6 is a partial cross-sectional view of FIG. 3, featuring the tile gap between the silicon tiles 304. The silicon tiles 304 are separated by a tile gap 600 in the range of 0.5 mm to 1 mm.

FIG. 7 is a flowchart illustrating a method for forming silicon target tiles in the fabrication of integrated circuit (IC) sputter deposited silicon films. Although the method has been depicted as a sequence of numbered steps for clarity, no ordering should be inferred from this numbering unless explicitly stated. The method begins at Step 700. Step 702 shapes silicon tiles. Shaping silicon tiles includes cutting tiles from a silicon ingot or block using a method selected from the group including saw cutting, laser cutting, high pressure water cutting, and router cutting. The silicon tiles are usually shaped to have a conventional (100) orientation, but other crystallographic orientations are possible. The shaping the silicon tiles includes cutting the silicon tiles to a thickness in the range of 7 millimeters (mm) to 10 mm.

Shaping silicon tiles in Step 702 includes shaping silicon tiles from a material selected from the group including single-crystal silicon (c-Si) and polycrystalline silicon (p-Si). In some aspects the silicon tiles are shaped from a silicon material doped with a p-type dopant with a resistivity in the range from 0.5 to 50 ohms per centimeter.

Step 704 treats the silicon tile edges to minimize the generation of contaminating particles. Step 704 treats the silicon tiles by subjecting the silicon tile top and bottom surface edges to a treatment selected from the group including beveling and radiusing. In Step 704a the silicon tile top surface edges are beveled within the range of 1 mm to 5 mm. Alternately, the silicon tile top surface edges are radiused within the range of 3 mm to 10 mm. In Step 704b the silicon tile bottom edges are beveled approximately 1.5 mm.

Step 704c includes subjecting the silicon tile corners to a treatment selected from the group including beveling and radiusing. In one aspect the silicon tile corners are beveled approximately 1.5 mm.

Step 706, following the treating of the silicon tile edges in Step 704, chemically etches the silicon tile surfaces. Chemically etching the silicon tile surfaces includes removing silicon material within the range of 50 microns (um) to 500 um. In some aspects chemically etching the silicon tile surfaces includes immersing the silicon tiles in a solution selected from the group including HNO3/HF/CH3COOH (4:1:3) and HF/HNO3 (1.6:1.8). Alternately, the chemically etching of the silicon tile surfaces in Step 706 includes immersing the silicon tiles in a solution that is a mixture of HNO3 and HF, with traces of CH3COOH.

Step 708, following the chemically etching of the silicon tiles in Step 706, polishes the silicon tile top and bottom surfaces to a predetermined flatness. Polishing the silicon tile top and bottom surfaces includes polishing the surfaces with a process selected from the group including sanding with small grit paper and chemical-mechanical polishing (CMP) with a SiO2 slurry. In some aspects polishing the silicon tile top and bottom surfaces in Step 708 includes polishing the surfaces to a flatness in the range of 5 um to 10 um. Alternately, the flatness is in the range of 1 um to 6 um, or 0.1 mm to 1 mm.

Step 710, following the polishing of the silicon tiles in Step 708, attaches a plurality of the silicon tiles to a backing plate to form a completed silicon target. Attaching a plurality of the silicon tiles to a backing plate to form a completed silicon target includes forming a silicon target with a surface of approximately 650 mm by 550 mm. When the silicon tiles are shaped from a polycrystalline silicon material in Step 702, four polycrystalline silicon tiles are typically attached to the backing plate. When the silicon tiles are shaped from a single-crystal silicon material, twenty single-crystal silicon tiles are attached to the backing plate.

In some aspects attaching a plurality of silicon tiles to a backing plate in Step 710 includes attaching each tile with adhesive placed on the silicon tile bottom surface, along the bottom surface edges to form an adhesive boundary, with indium placed inside the adhesive boundary.

FIG. 8 is a flowchart illustrating an alternate method for a forming a silicon target in the fabrication of IC sputter deposited silicon films. The method starts at Step 800. Step 802 cuts silicon tiles to a thickness in the range from 7 mm to 10 mm. Step 804 subjects the silicon tile top and bottom surface edges to a treatment selected from the group including beveling and radiusing. Step 806 bevels the silicon tile corners approximately 1.5 mm. Step 808 chemically etches the silicon tile surfaces to remove silicon material within the range of 50 microns (um) to 500 um. Step 810 polishes the silicon tile top and bottom surfaces to a predetermined flatness within the range of 0.1 um to 10 um. Step 812 attaches a plurality of the silicon tiles to a backing plate to form a completed silicon target. Attaching a plurality of the silicon tiles to a backing plate to form a completed silicon target in Step 812 includes forming a silicon target with a surface of approximately 650 mm by 550 mm.

In some aspects Step 804 includes the silicon tile top surface edges being beveled within the range of 1 mm to 5 mm. Alternately, the silicon tile top surface edges are radiused within the range of 3 mm to 10 mm. Step 804 also includes the silicon tile bottom surface edges being beveled approximately 1.5 mm.

In some aspects of the invention Step 808 chemically etches the silicon tile surfaces by immersing the silicon tiles in a solution that is a mixture of HNO3 and HF, with traces of CH3COOH.

The invention is applicable to the fabrication of polysilicon thin film transistors (TFTs), such as might be used in liquid crystal displays (LCDs). However, improvements in the fabrication of TFTs would also be applicable to other areas of IC technology such as X-ray imaging technology and sensor arrays, as well as specific products or product concepts, such as sheet computer, sheet phone, sheet recorder, etc. Other variations and embodiments of the above-described invention will occur to those skilled in the art.

We claim:

1. In the fabrication of integrated circuit (IC) sputter deposited silicon films, a method for forming silicon (Si) target tiles, the method comprising:
   shaping silicon tiles;
   treating the silicon tile edges to minimize the generation of contaminating particles; and
   following the treating of the silicon tile edges, chemically etching the silicon tile surfaces.

2. The method of claim 1 wherein shaping silicon tiles includes cutting tiles from a silicon ingot using a method selected from the group including saw cutting, laser cutting, high pressure water cutting, and router cutting.

3. The method of claim 1 wherein shaping the silicon tiles includes cutting the silicon tiles to a thickness in the range of 7 millimeters (mm) to 10 mm.

4. The method of claim 1 wherein shaping silicon tiles includes shaping silicon tiles from a material selected from the group including single-crystal silicon (c-Si) and polycrystalline silicon (p-Si).

5. The method of claim 1 wherein shaping silicon tiles includes shaping silicon tiles from a silicon material doped with a p-type dopant with a resistivity in the range from 0.5 to 50 ohms per centimeter.

6. The method of claim 1 wherein chemically etching the silicon tile surfaces includes removing silicon material within the range of 50 microns (um) to 500 um.

7. The method of claim 1 wherein chemically etching the silicon tile surfaces includes immersing the silicon tiles in a solution selected from the group including HNO3/HF/CH3COOH (4:1:3) and HF/HNO3 (1.6:1.8).

8. The method of claim 1 wherein chemically etching the silicon tile surfaces includes immersing the silicon tiles in a solution that is a mixture of HNO3 and HF, with traces of CH3COOH.

9. The method of claim 1 wherein shaping silicon tiles includes shaping the silicon tiles having a (100) orientation.

10. The method of claim 1 wherein treating the silicon tiles includes subjecting the silicon tile top and bottom surface edges to a treatment selected from the group including beveling and radiusing.

11. The method of claim 1 wherein treating the silicon tiles includes subjecting the silicon tile corners to a treatment selected from the group including beveling and radiusing.

12. The method of claim 1 further comprising:
   following the chemically etching of the silicon tiles, polishing the silicon tile top and bottom surfaces to a predetermined flatness.

13. The method of claim 10 wherein the silicon tile top surface edges are beveled within the range of 1 mm to 5 mm.

14. The method of claim 10 wherein the silicon tile top surface edges are radiused within the range of 3 mm to 10 mm.

15. The method of claim 10 wherein the silicon tile bottom surface edges are beveled approximately 1.5 mm.

16. The method of claim 11 wherein the silicon tile corners are beveled approximately 1.5 mm.

17. The method of claim 12 wherein polishing the silicon tile top and bottom surfaces includes polishing the surfaces with a process selected from the group including sanding with small grit paper and chemical-mechanical polishing (CMP) with a SiO2 slurry.

18. The method of claim 12 wherein polishing the silicon tile top and bottom surfaces includes polishing the surfaces to a flatness in the range of 5 um to 10 um.

19. The method of claim 12 wherein polishing the silicon tile top and bottom surfaces includes polishing the surfaces to a flatness in the range of 1 um to 6 um.

20. The method of claim 12 wherein polishing the silicon tile top and bottom surfaces includes polishing the surfaces to a flatness in the range of 0.1 um to 1 um.

21. The method of claim 12 further comprising:
   following the polishing of the silicon tiles, attaching a plurality of the silicon tiles to a backing plate to form a completed silicon target.

22. The method of claim 21 wherein attaching a plurality of silicon tiles to a backing plate includes attaching each silicon tile with adhesive placed on the silicon tile bottom surface, along, the bottom surface edges to form an adhesive boundary, with indium placed inside the adhesive boundary.

23. The method of claim 21 wherein attaching a plurality of the silicon tiles to a backing plate to form a completed silicon target includes forming a silicon target with a surface of approximately 650 mm by 550 mm.

24. The method of claim 23 wherein shaping silicon tiles includes shaping the tiles from a polycrystalline silicon material; and
    wherein attaching a plurality of silicon tiles to a backing plate includes attaching four polycrystalline silicon tiles.

25. The method of claim 23 wherein shaping silicon tiles includes shaping the tiles from a single-crystal silicon material; and
    wherein attaching a plurality of silicon tiles to a backing plate includes attaching twenty single-crystal silicon tiles.

26. In the fabrication of integrated circuit (IC) sputter deposited silicon films, a method for a forming a silicon (Si) target, the method comprising:
    cutting silicon tiles to a thickness in the range from 7 millimeters (mm) to 10 mm;
    subjecting the silicon tile top and bottom surface edges to a treatment selected from the group including beveling and radiusing;
    beveling the silicon tile corners approximately 1.5 mm;
    chemically etching the silicon tile surfaces to remove silicon material within the range of 50 microns (um) to 500 um;
    polishing the silicon tile top and bottom surfaces to a predetermined flatness within the range of 0.1 um to 10 um; and,
    attaching a plurality of the silicon tiles to a backing plate to form a completed silicon target.

27. The method of claim 26 wherein subjecting the silicon tile top surface edges to a treatment includes beveling the top surfaces edges within the range of 1 mm to 5 mm.

28. The method of claim 26 wherein subjecting the silicon tile top surface edges to a treatment includes radiusing the top surface edges within the range of 3 mm to 10 mm.

29. The method of claim 26 wherein subjecting the silicon tile bottom surface edges to a treatment includes beveling the bottom surface edges approximately 1.5 mm.

30. The method of claim 26 wherein chemically etching the silicon tile surfaces includes immersing the silicon tiles in a solution that is a mixture of HNO3 and HF, with traces of CH3COOH.

31. The method of claim 26 wherein attaching a plurality of the silicon tiles to a backing plate to form a completed silicon target includes forming a silicon target with a surface of approximately 650 mm by 550 mm.

32. In the fabrication of integrated circuit (IC) sputter deposited silicon films, a method for forming silicon (Si) target tiles, the method comprising:
    shaping silicon tiles;
    treating the silicon tile edges, to minimize the generation of contaminating particles, by:
        subjecting the silicon tile bottom surface edges to a treatment selected from the group including beveling and radiusing; and
        beveling the silicon tile top surface edges within the range of 1 mm to 5 mm.

33. In the fabrication of integrated circuit (IC) sputter deposited silicon films, a method for forming silicon (Si) target tiles, the method comprising:
    shaping silicon tiles;
    treating the silicon tile edges, to minimize the generation of contaminating particles, by:
        subjecting the silicon tile bottom surface edges to a treatment selected from the group including beveling and radiusing; and
        radiusing the silicon tile top surface edges within the range of 3 mm to 10 mm.

34. In the fabrication of integrated circuit (IC) sputter deposited silicon films, a method for forming silicon (Si) target tiles, the method comprising:
    shaping silicon tiles;
    treating the silicon tile edges, to minimize the generation of contaminating particles, by:
        subjecting the silicon tile top surface edges to a treatment selected from the group including beveling and radiusing; and
        beveling the silicon tile bottom surface edges approximately 1.5 mm.

35. In the fabrication of integrated circuit (IC) sputter deposited silicon films, a method for forming silicon (Si) target tiles, the method comprising:
    shaping silicon tiles; and
    treating the silicon tile edges, to minimize the generation of contaminating particles, by beveling the silicon tile corners approximately 1.5 mm.

36. In the fabrication of integrated circuit (IC) sputter deposited silicon films, a method for forming silicon (Si) target tiles, the method comprising:
    shaping silicon tiles from a silicon material doped with a p-type dopant and a resistivity in the range from 0.5 to 50 ohms per centimeter; and
    treating the silicon tile edges to minimize the generation of contaminating particles.

\* \* \* \* \*